(12) United States Patent
Lin et al.

(10) Patent No.: US 11,952,676 B2
(45) Date of Patent: Apr. 9, 2024

(54) SILICON CARBIDE CRYSTAL

(71) Applicant: GlobalWafers Co., Ltd., Hsinchu (TW)

(72) Inventors: Ching-Shan Lin, Hsinchu (TW);
Jian-Hsin Lu, Hsinchu (TW);
Chien-Cheng Liou, Hsinchu (TW);
Man-Hsuan Lin, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 366 days.

(21) Appl. No.: 17/072,973

(22) Filed: Oct. 16, 2020

(65) Prior Publication Data
US 2021/0054525 A1 Feb. 25, 2021

Related U.S. Application Data

(62) Division of application No. 15/941,129, filed on Mar. 30, 2018, now Pat. No. 10,851,470.

(30) Foreign Application Priority Data

Oct. 6, 2017 (TW) .................................. 106134548

(51) Int. Cl.
| | |
|---|---|
| H01L 29/16 | (2006.01) |
| C30B 23/00 | (2006.01) |
| C30B 23/02 | (2006.01) |
| C30B 25/02 | (2006.01) |
| C30B 29/36 | (2006.01) |
| H01L 21/02 | (2006.01) |
| H01L 29/32 | (2006.01) |
| H01L 29/36 | (2006.01) |

(52) U.S. Cl.
CPC .......... *C30B 23/025* (2013.01); *C30B 23/005* (2013.01); *C30B 25/02* (2013.01); *C30B 29/36* (2013.01); *H01L 21/02378* (2013.01); *H01L 21/02447* (2013.01); *H01L 21/02507* (2013.01); *H01L 21/0251* (2013.01); *H01L 21/02529* (2013.01); *H01L 21/02576* (2013.01); *H01L 21/02631* (2013.01); *H01L 29/1608* (2013.01); *H01L 29/32* (2013.01); *H01L 29/36* (2013.01)

(58) Field of Classification Search
CPC .................................................... H01L 29/1608
USPC .......................................................... 257/77
See application file for complete search history.

(56) References Cited

U.S. PATENT DOCUMENTS

2010/0031877 A1 * 2/2010 Gupta ................... C30B 23/002
117/105
2018/0187332 A1 * 7/2018 Powell .................. H01L 29/167

* cited by examiner

*Primary Examiner* — Hsin Yi Hsieh
(74) *Attorney, Agent, or Firm* — Li & Cai Intellectual Property (USA) Office

(57) ABSTRACT

A silicon carbide crystal includes a seed layer, a bulk layer and a stress buffering structure formed between the seed layer and the bulk layer. The seed layer, the bulk layer and the stress buffering structure are each formed with a dopant that cycles between high and low dopant concentration. The stress buffering structure includes a plurality of stacked buffer layers and a transition layer over the buffer layers. The buffer layer closest to the seed layer has the same variation trend of the dopant concentration as the buffer layer closest to the transition layer, and the dopant concentration of the transition layer is equal to the dopant concentration of the seed layer.

2 Claims, 17 Drawing Sheets

SILICON CARBIDE CRYSTAL

CROSS-REFERENCE TO RELATED PATENT APPLICATION

This application is a divisional application of U.S. application Ser. No. 15/941,129, filed on 30 Mar. 2018 and entitled "SILICON CARBIDE CRYSTAL AND METHOD FOR MANUFACTURING THE SAME". The entire disclosures of which are incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The instant disclosure relates to an epitaxial crystal structure and a method for manufacturing the same, and more particularly to a silicon carbide crystal and a method for manufacturing the same.

BACKGROUND OF THE DISCLOSURE

Materials such as silicon (Si) and gallium arsenide (GaAs) are widely used in semiconductor devices. However, these materials have a relatively small energy gap (i.e., 1.2 eV for Si and 1.42 eV for GaAs) and a relatively low breakdown voltage that are unfavorable for high power and high frequency application. Silicon carbide (SiC) is a material that has excellent physical and chemical properties such as wide energy gap, high thermal and electrical conductivity, high withstand voltage, and high saturation drift velocity of electrons, and is expected to be used in next-generation semiconductor devices.

SiC crystals do not exist in nature. The physical vapor transport (PVT) process is the main process for growing large-scale SiC single crystals. In this process, an SiC seed crystal is disposed in a low temperature region of a crystal growth crucible and an SiC raw material is disposed in a high temperature region. Then, the crystal growth crucible is filled with a noble gas and heated to a temperature between 1450° C. to 2400° C. Thus, the SiC raw material can be sublimated and epitaxially grown on the SiC seed crystal.

However, the growth speed of the SiC single crystal is slow and the growth mechanism of the SiC single crystal is very complex. In addition, the PVT process needs to create a temperature gradient in the growth of the SiC single crystal and thus causes difficulty in controlling of process parameters such as heat field uniformity and gas phase composition. Once the process parameters are unstable, defects such as the micropipe defect and basal planar dislocation can easily occur in the obtained single crystal structure. In particular, the micropipe defect limits the application of the SiC single crystal.

SUMMARY OF THE DISCLOSURE

In response to the above-referenced technical inadequacies, the present disclosure provides a silicon carbide crystal having high quality.

In one aspect, the present disclosure provides a silicon carbide crystal including a seed layer, a bulk layer, and a stress buffering structure formed between the seed layer and the bulk layer. The seed layer, the bulk layer, and the stress buffering structure are each formed with a dopant, and the dopant of the stress buffering structure cycles between high and low dopant concentrations. The stress buffering structure includes a plurality of stacked buffer layers and a transition layer over the buffer layers, wherein the buffer layer closest to the seed layer has the same variation trend of the dopant concentration as the buffer layer closest to the transition layer, and the dopant concentration of the transition layer is equal to the dopant concentration of the seed layer.

One of the advantages of the instant disclosure is that the silicon carbide crystal can have a reduced defect density and a low residual stress level so as to increase crystal quality, by virtue of "the buffer layer closest to the seed layer has the same variation trend of the dopant concentration as the buffer layer closest to the transition layer" and "the dopant concentration of the transition layer is equal to the dopant concentration of the seed layer".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
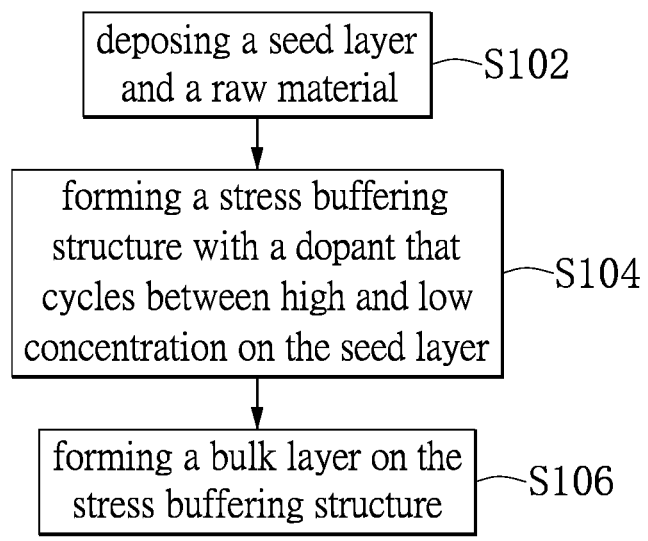
FIG. 1 is a flowchart of a method for manufacturing a silicon carbide crystal of the instant disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the instant disclosure provides a method S100 for manufacturing a silicon carbide (SiC) crystal which includes the following steps. Step S102 is disposing a seed layer and a raw material. Step S104 is forming a stress buffering structure with a dopant that cycles between high and low dopant concentrations on the seed layer. Step S106 is forming a bulk layer on the stress buffering structure.

Figure 2:
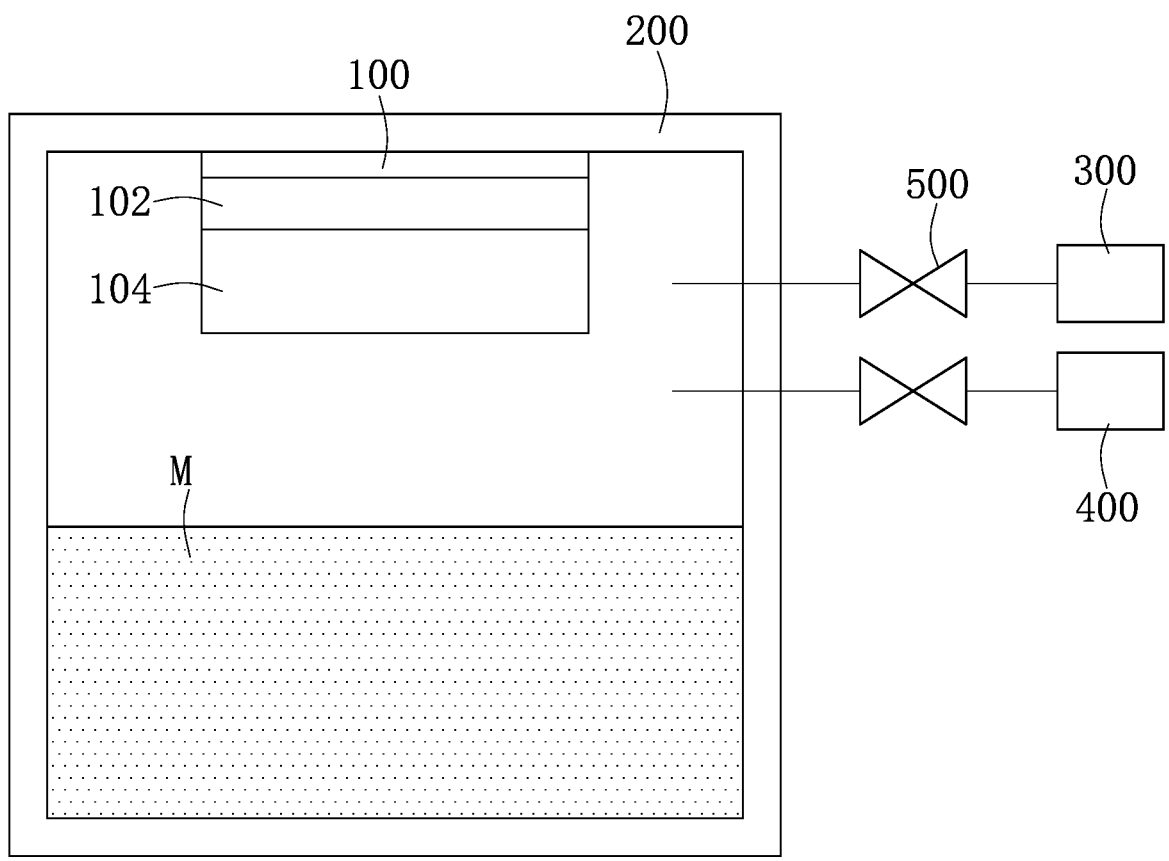
FIG. 2 is a perspective view of a system for manufacturing the silicon carbide crystal of the instant disclosure.

Reference is next made to FIG. 2. In the step S102, the seed layer 100 and the raw material M can be disposed in a reactor 200. For example, the seed layer 100 is disposed at a top of the reactor 200 and the raw material M is disposed at a bottom of the reactor 200. The seed layer 100 is an SiC seed crystal. The raw material M is a solid material including elements of Si and C for crystal growth, such as an SiC powder and a mixture of pulverized Si particles and carbon powder. The reactor 200 can be a graphite crucible. The reactor 200 can be covered with a thermal insulation material and be disposed in a vacuum chamber (not shown).

Figure 3A:
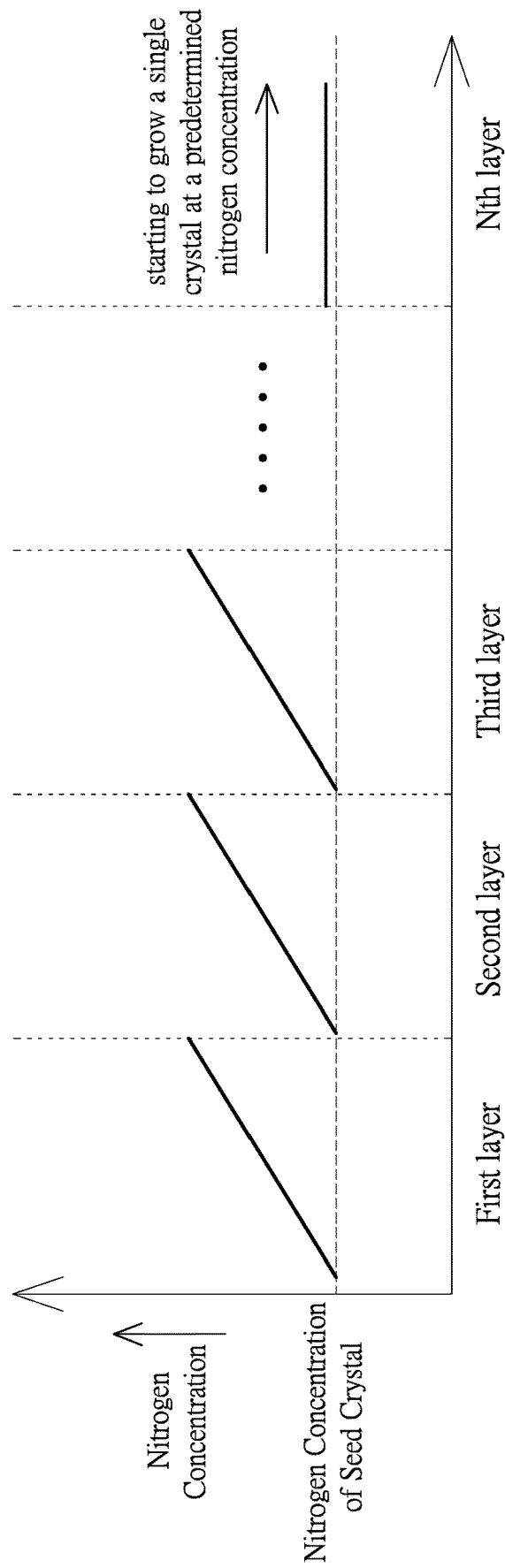
FIGS. 3A and 3B are diagrams showing a variation of alternating high and low dopant concentrations in step S104 of the method according to a first embodiment of the instant disclosure.
Figure 3B:
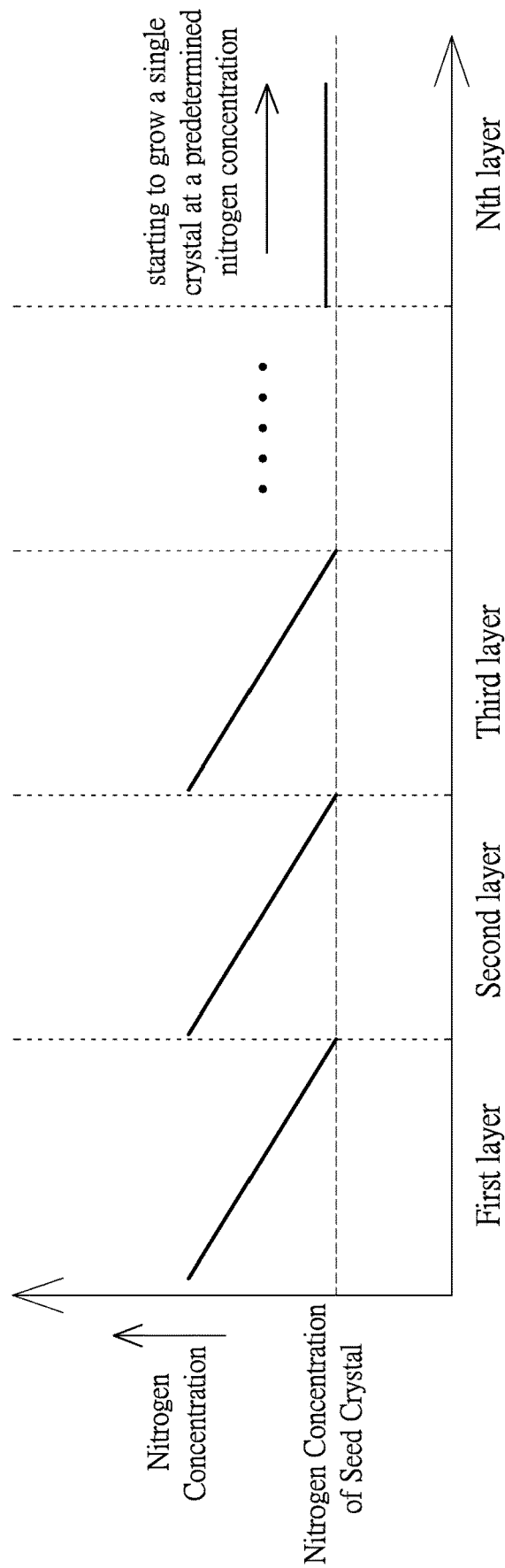

Referring to FIGS. 2, 3A and 3B, in the step S104, a process within the reactor 200 is initiated at a pressure of about 300 Torr or greater and a temperature between about 1900° C. and about 2100° C. After that, the dopant is fed in gas form into the reactor 200, and the concentration thereof is controlled to gradually increase or decrease between a dopant concentration of the seed layer 100 and a first concentration higher than or close to the dopant concentration of the seed layer 100. In the present embodiment, the dopant of the seed layer 100 is present in a reference concentration. The dopant of the stress buffering structure 102 has a variation of dopant concentration, in which the dopant concentration alternates between high and low concentrations. That is, the dopant concentration of the stress buffering structure 102 gradually increases from the reference concentration to the first concentration in each of at least three successive predetermined time intervals, as shown in FIG. 3A, or gradually decreases from the first concentration to the reference concentration in each of at least three successive predetermined time intervals, as shown in FIG. 3B. Preferably, the stress buffering structure 102 includes a plurality of buffer layers 1022 each having a maximum dopant concentration that is not larger than ten times the reference concentration.

Although the dopant used in the present embodiment is nitrogen as shown in FIGS. 3A and 3B, the dopant can be selected according to practical requirements. For example, the dopant can be boron (B), phosphorus (P), or aluminum (Al).

Figure 4:
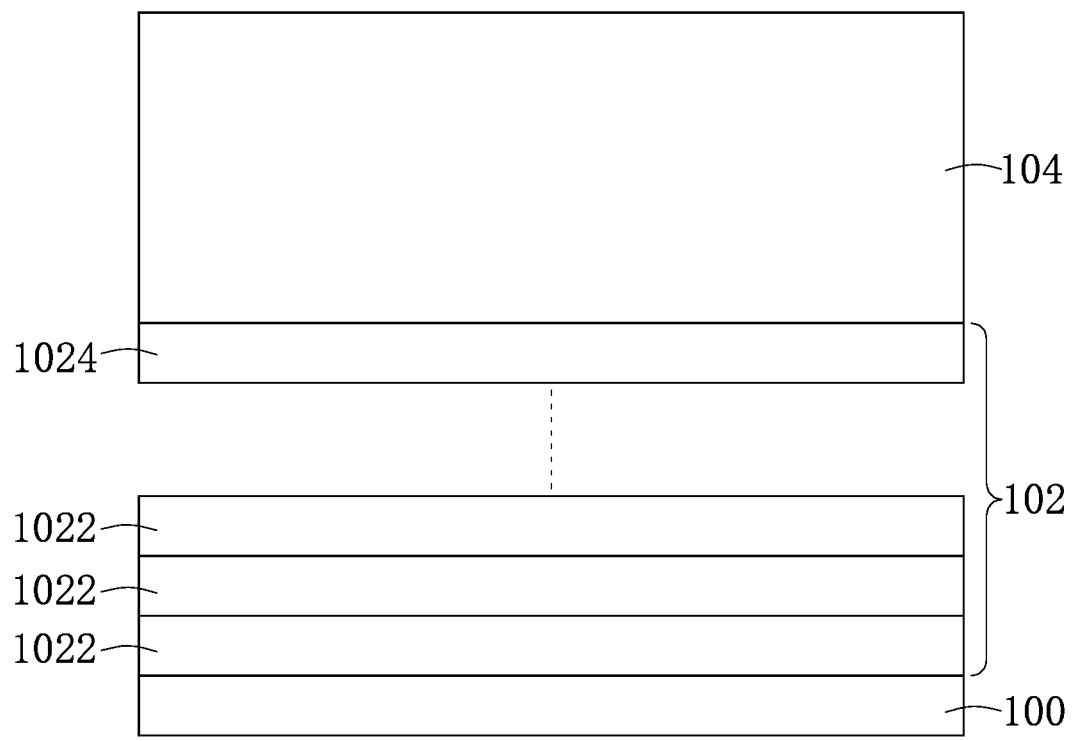
FIG. 4 is a planar view of the silicon carbide crystal of the instant disclosure.

Reference is made to FIGS. 3A, 3B and 4. The stress buffering structure 102 can have at least three successive gradations in dopant concentration according to particular implementations, in which a buffer layer 1022 can be formed after the completion of each of the gradations in dopant concentration. More specifically, the stress buffering structure 102 includes a plurality of buffer layers 1022 (e.g., at least three buffer layers). Each of the buffer layers 1022 has a thickness greater than 0 μm and less than 0.1 μm, and has a dopant concentration gradient in its thickness direction. The dopant concentration gradient gradually increases or decreases between the first concentration and the reference concentration. After a desired number of the buffer layers 1022 is formed, a transition layer 1024 is formed over the buffer layers 1022, which has a dopant concentration that is approximately equal to the dopant concentration of the seed layer 100. As a result, the stress buffering structure 102 is completed.

It should be noted that, the stress buffering structure 102 has a thickness of less than 0.1 mm, and includes a plurality of stacked buffer layers 1022 and a transition layer 1024 over the buffer layers 1022. The buffer layer 1022 closest to the seed layer 100 has the same variation trend of the dopant concentration as the buffer layer 1022 closest to the transition layer 104. The transition layer 1024 has a dopant concentration equal to the dopant concentration of the seed layer 100.

In the present embodiment, the dopant is exemplified by nitrogen, and a nitrogen gas can be provided by a nitrogen gas source 300 and its flow rate can be controlled by a mass flow controller (MFC) 400. The MFC 400 enables a precise control of the flow rate of the nitrogen gas, such that the variation of the dopant concentration as mentioned above can be achieved. The minimum flow rate of the nitrogen gas can reach about 0.01 sccm (standard cubic cm per minute) and the maximum flow rate of the nitrogen gas can reach about 30,000 sccm. Preferably, the seed layer 100 has a nitrogen concentration from about $1 \times 10^{15}/cm^3$ to about $1 \times 10^{19}/cm^3$. The maximum nitrogen concentration of the stress buffering structure 102 is not higher than ten times the nitrogen concentration of the seed layer 100.

Furthermore, the pressure in the reactor 200 can be maintained at a predetermined value in the presence of a noble gas. The noble gas such as argon (Ar) can be supplied from an argon gas source 500 connected to the reactor 200. The temperature in the reactor 200 can be quickly heated to a predetermined value by an induction coil (not shown).

Referring to FIGS. 2 and 4, in the step S106, the processing conditions in the reactor are changed in relation to the growth of the bulk layer 104. More specifically, the pressure in the reactor 200 is reduced to lower than 100 Torr, the temperature in the reactor 200 is increased to a temperature from about 2100° C. to about 2200° C., and the supplied flow rate of the nitrogen gas is unchanged. The dopant concentration of the bulk layer 104 is equal to or close to that of the seed layer 100. The bulk layer 104 is formed of the same crystal material as the seed layer 100, such as 3C—SiC, 4H—SiC, and 6H—SiC. The bulk layer 104 can be used to manufacture semiconductor elements or new seed crystals.

It should be noted that the method S100 for manufacturing a silicon carbide crystal of the instant disclosure forms a stress buffering structure 102 on the seed layer 100, which has a dopant that cycles between high and low dopant concentrations before growing the seed layer 104 (i.e., the initial stage of the crystal growth). Therefore, the interface defects between the seed and bulk layers and the crystal defects can be reduced, the residual stress in the crystal can be reduced, and the crystal growth time can be shortened.

Second Embodiment

Figure 5A:
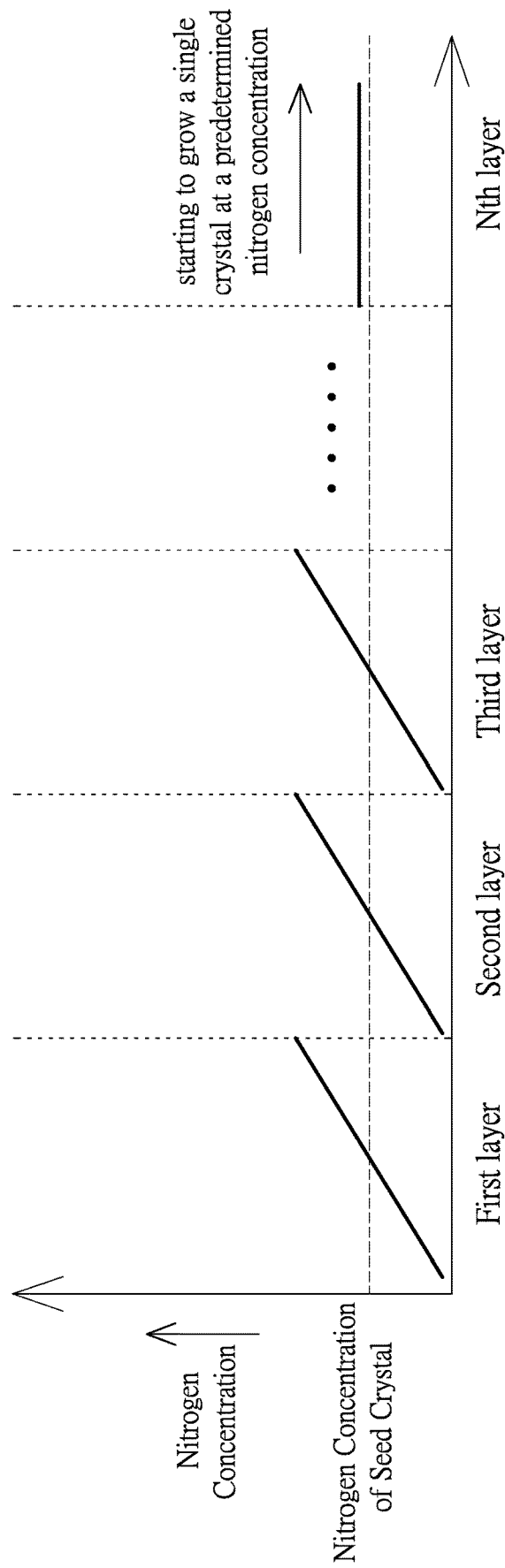
FIGS. 5A and 5B are diagrams showing a variation of alternating high and low dopant concentrations in step S104 of the method according to a second embodiment of the instant disclosure.
Figure 5B:
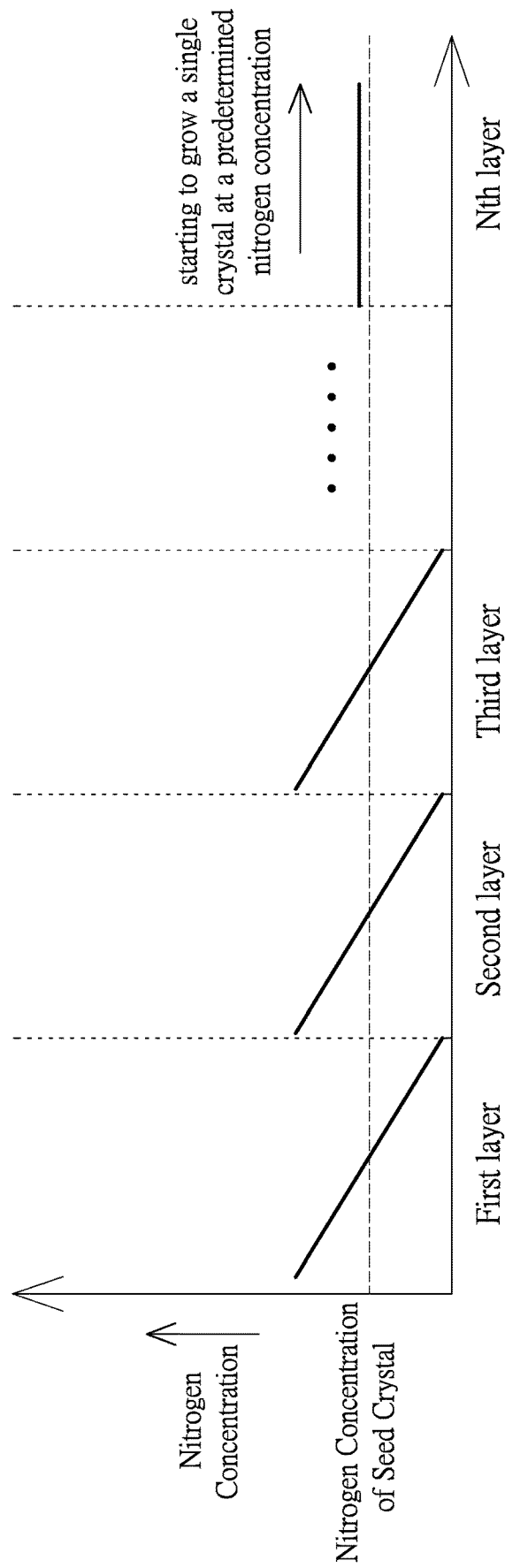

Reference is made to FIGS. 5A and 5B, which show another variation of alternating high and low dopant concentrations in the step S104. The main difference between the first and second embodiments is that, the dopant concentration of the stress buffering structure 102 is controlled to gradually increase or decrease between a first concentration higher than the dopant concentration of the seed layer 100 and a second concentration lower than the dopant concentration of the seed layer 100. More specifically, the dopant in the seed layer 100 is present in a reference concentration. The dopant of the stress buffering structure 102 has a variation of dopant concentration, in which the dopant concentration alternates between high and low concentrations. That is, the dopant concentration of the stress buffering structure 102 gradually increases from the second concentration to the first concentration in each of at least three successive predetermined time intervals, as shown in FIG. 5A, or gradually decreases from the first concentration to the second concentration in each of the at least three successive predetermined time intervals, as shown in FIG. 5B.

Referring to FIG. 4, the resulting stress buffering structure 102 according to the second embodiment includes a plurality of stacked buffer layers 1022 (i.e., at least three stacked buffer layers) and a transition layer 1024 over the buffer layers 1022. Each of the buffer layers 1022 has a dopant concentration gradient in its thickness direction, which gradually increases or decreases between the first concentration and the second concentration. Each of the buffer layers 1022 has a thickness greater than 0 μm and less than 0.1 μm. The stress buffering structure 102 has a thickness of less than 0.1 mm.

Third Embodiment

Figure 6A:
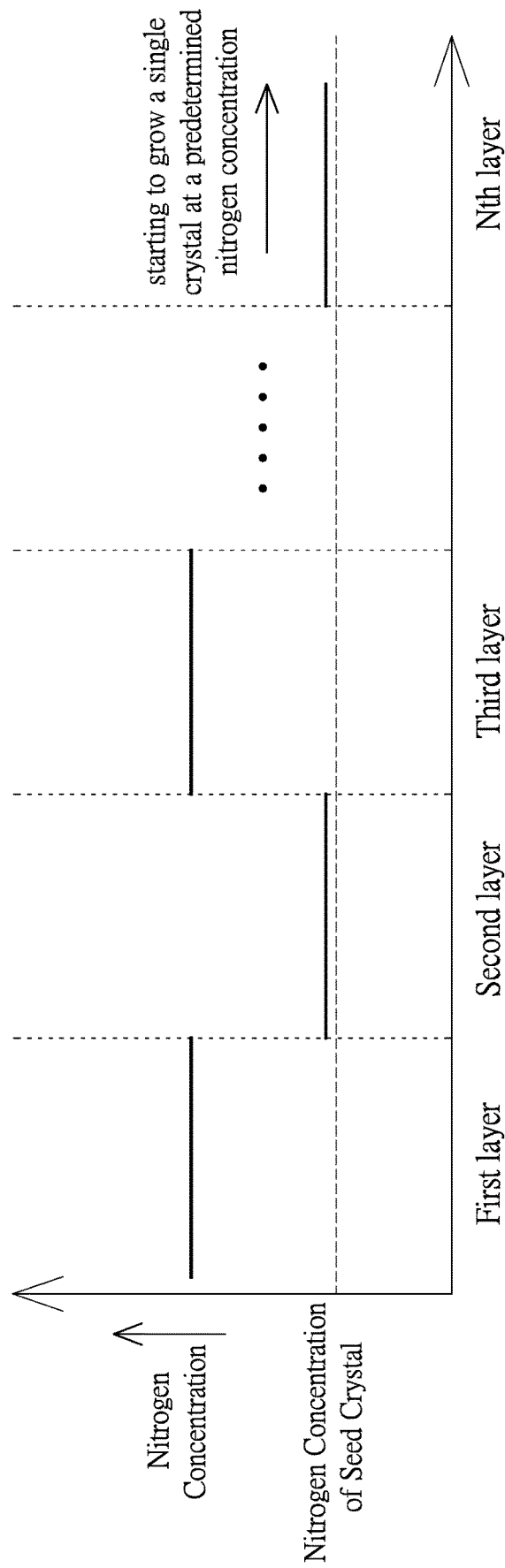
FIGS. 6A and 6B are diagrams showing a variation of alternating high and low dopant concentrations in step S104 of the method according to a third embodiment of the instant disclosure.
Figure 6B:
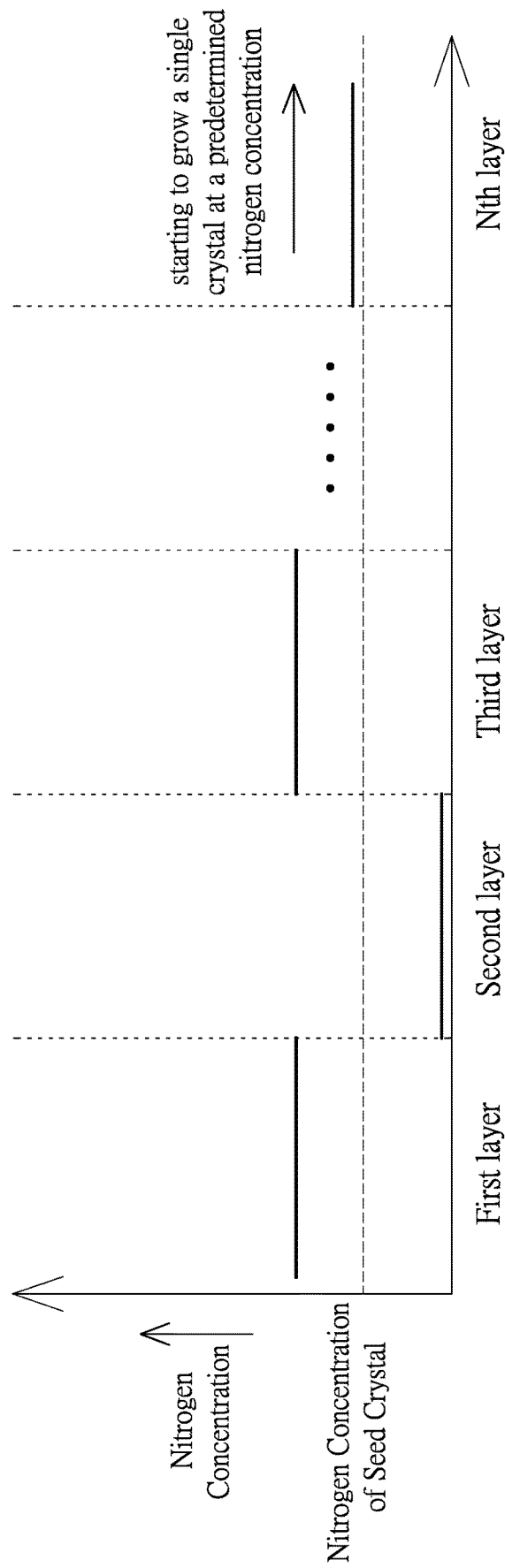

Reference is made to FIGS. 6A and 6B, which show still another variation of alternating high and low dopant concentrations in the step S104. The main difference between the third and above-mentioned embodiments is that, the dopant concentration of the stress buffering structure 102 is controlled to alternate between the dopant concentration of the seed layer 100 and a first concentration higher than the dopant concentration of the seed layer 100, or alternate between a first concentration higher than the dopant concentration of the seed layer 100 and a second concentration lower than the dopant concentration of the seed layer 100. More specifically, the dopant of the seed layer 100 is present in a reference concentration. The dopant of the stress buffering structure 102 has a variation of dopant concentration, in which the dopant concentration alternates between high and low concentrations. That is, the dopant concentration of the stress buffering structure 102 alternates from the first concentration in one of at least three successive predetermined time intervals to the second concentration in a later one of the at least three successive predetermined time intervals.

Figure 7:
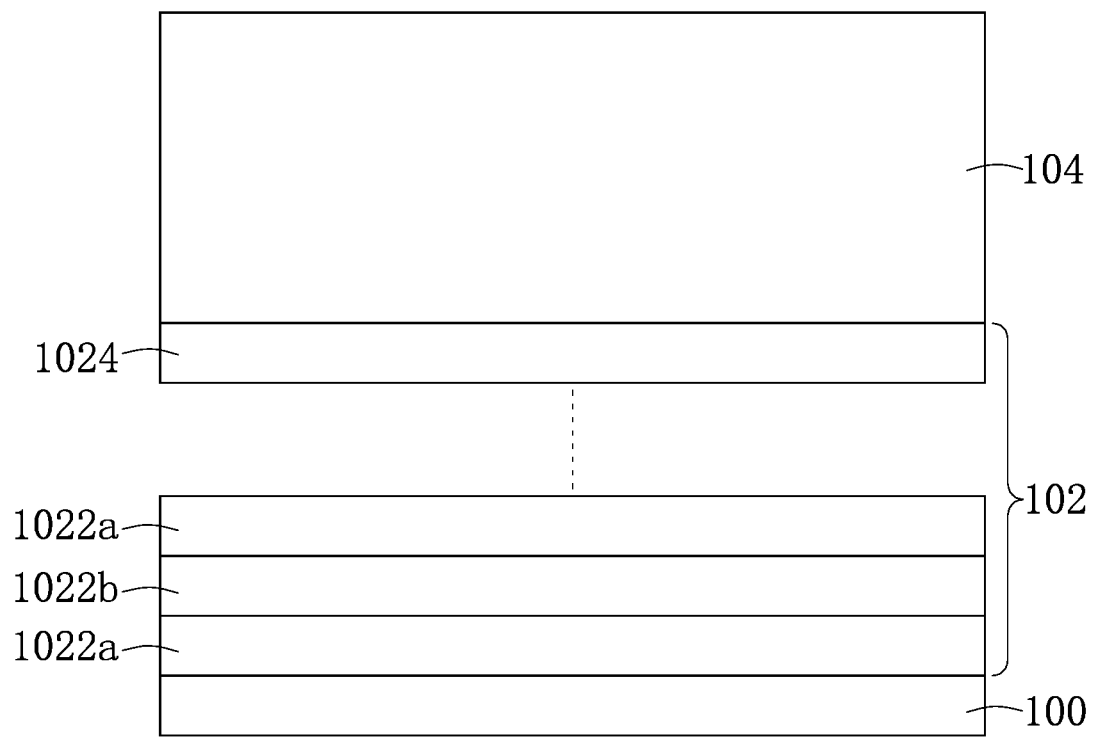
FIG. 7 is another cross-sectional perspective view of the silicon carbide crystal of the instant disclosure.

Referring to FIG. 7, the resulting stress buffering structure 102 according to the third embodiment includes at least one first buffer layer 1022*a*, at least one second buffer layer 1022*b* alternately stacked with the at least one first buffer layer 1022*a*, and a transition layer 1024 over the first and second buffer layers 1022*a*, 1022*b*. The sum of the number of the first and second buffer layers 1022*a*, 1022*b* are not less than three. The dopant of the first buffer layer 1022*a* is present in a constant concentration higher than the reference concentration, and the dopant of the second buffer layer 1022*b* has a constant concentration lower than or equal to the reference concentration. The first and second buffer layers 1022*a*, 1022*b* each have a thickness greater than 0 μm and less than 0.1 μm. The stress buffering structure 102 has a thickness of less than 0.1 mm.

Fourth Embodiment

Figure 8:
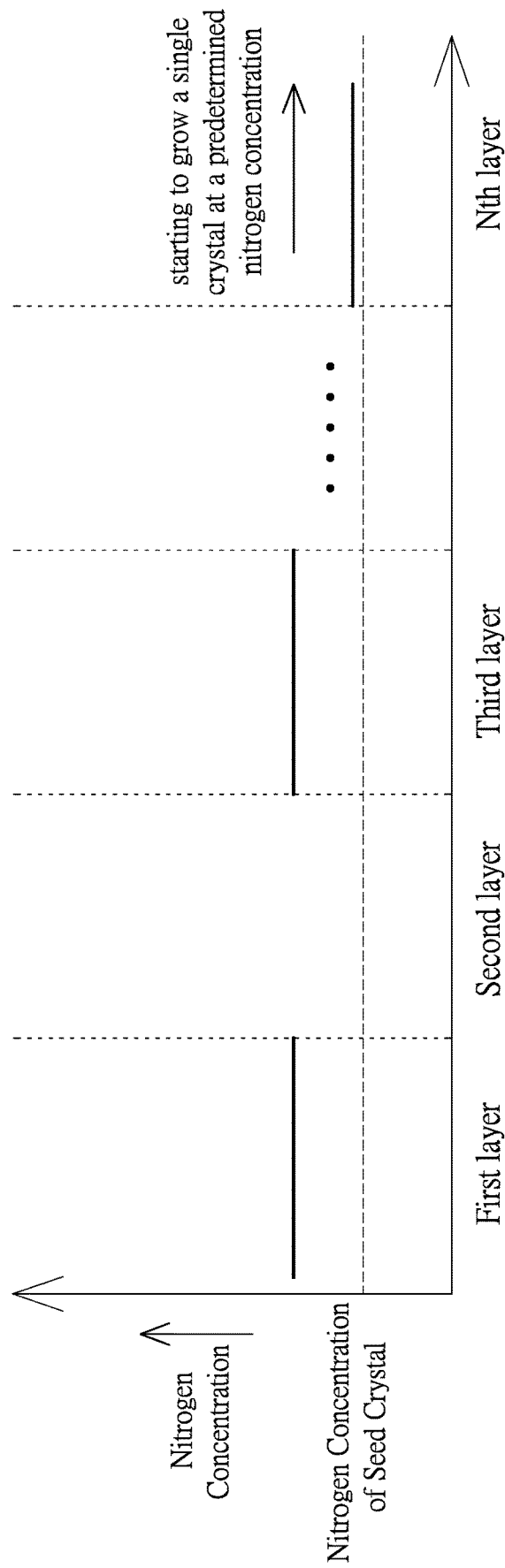
FIG. 8 is a diagram showing a variation of alternating high and low dopant concentrations in step S104 of the method according to a fourth embodiment of the instant disclosure.

Reference is made to FIG. 8, which show still another variation of alternating high and low dopant concentrations in the step S104. The main difference between the fourth and the above-mentioned embodiments is that, the dopant in the stress buffering structure 102 is intermittently doped at a first concentration higher than or equal to the dopant concentration of the seed layer 100. In this embodiment, the term "intermittently implemented" is used to mean that the dopant is doped after every predetermined time interval.

Referring to FIG. 7, the grown stress buffering structure 102 according to this embodiment includes at least one first buffer layer 1022*a*, at least one second buffer layer 1022*b* alternately stacked with the at least one first buffer layer 1022*a*, and a transition layer 1024 over the first and second buffer layers 1022*a*, 1022*b*. The dopant of each first buffer layer 1022*a* has a constant concentration higher than or equal to the reference concentration, and the dopant in each second buffer layer 1022*b* has a zero concentration or a concentration approaching zero. The first and second buffer layers 1022*a*, 1022*b* each have a thickness greater than 0 μm and less than 0.1 μm. The stress buffering structure 102 has a thickness of less than 0.1 mm.

Fifth Embodiment

Figure 9:
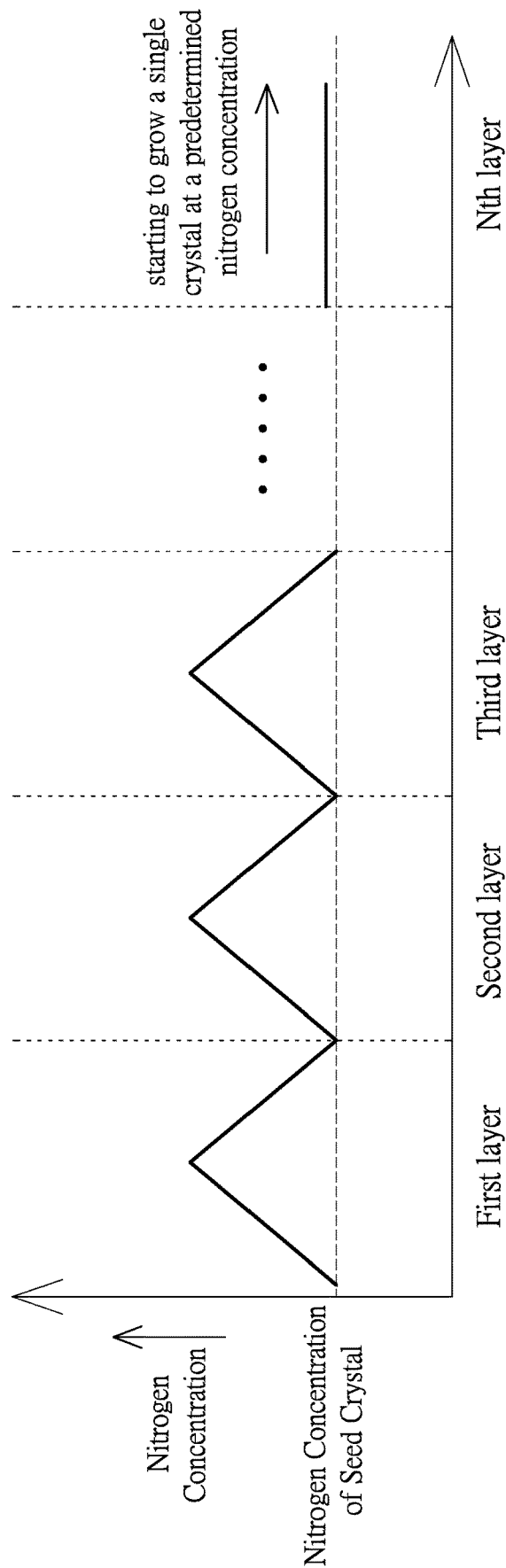
FIGS. 9, 10A and 10B are diagrams showing a variation of alternating high and low dopant concentrations in step S104 of the method according to a fifth embodiment of the instant disclosure.
Figure 10A:
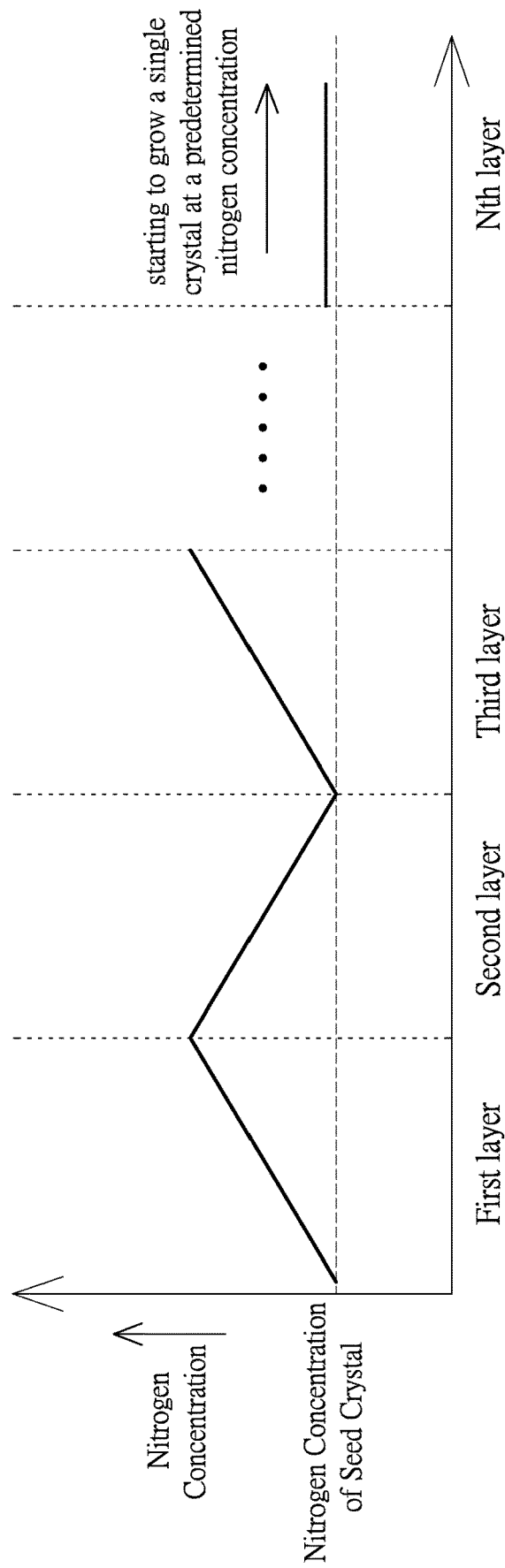
Figure 10B:
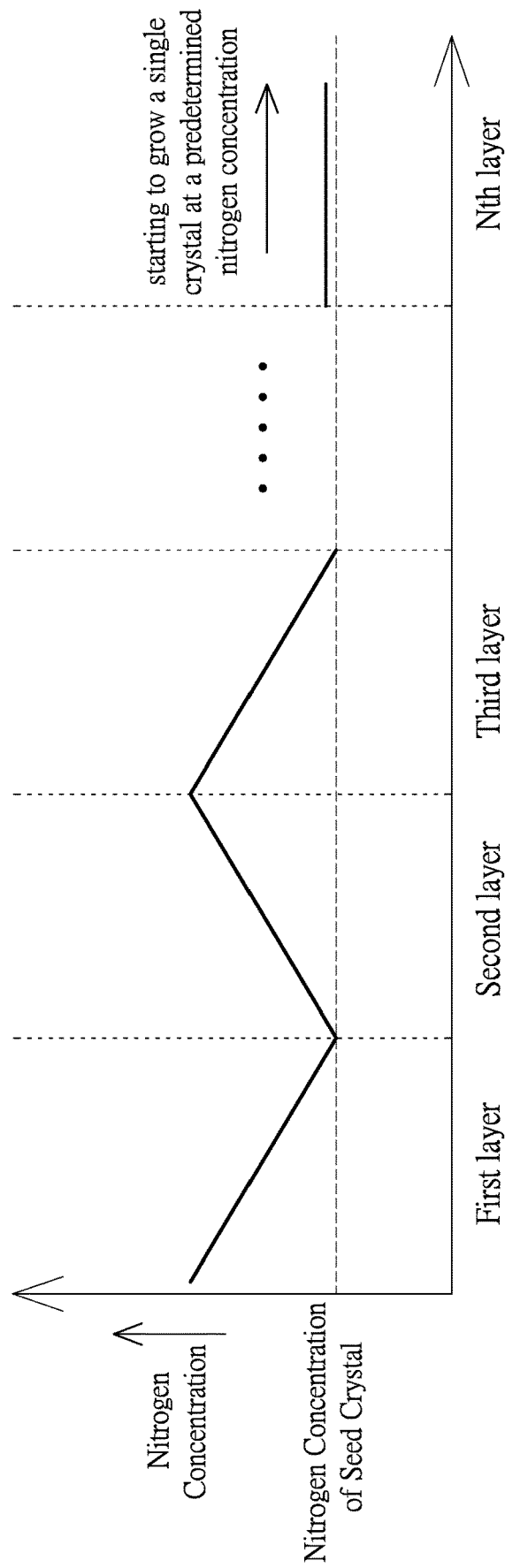

Reference is made to FIGS. 9, 10A and 10B, which show still another variation of alternating high and low dopant concentrations in the step S104. The main difference between the fifth and the above-mentioned embodiments is that, the dopant concentration of the stress buffering structure 102 is controlled to gradually increase or decrease between the dopant concentration of the seed layer 100 serving as a reference concentration and a predetermined peak concentration. More specifically, the dopant of the seed layer 100 is present in a reference concentration. The dopant of the stress buffering structure 102 has a variation of dopant concentration, in which the dopant concentration alternates between high and low concentrations. That is, the dopant concentration of the stress buffering structure 102 gradually increases from the reference concentration to the predetermined peak concentration and then gradually decreases from the predetermined peak concentration to the reference concentration in each of at least three successive predetermined time intervals. Also, the dopant concentration of the stress buffering structure 102 gradually decreases from the predetermined peak concentration to the reference and then gradually increases from the reference concentration to the predetermined peak concentration in each of the at least three successive predetermined time intervals.

It should be noted that, the variation of alternating high and low dopant concentrations as shown in FIGS. 10A and 10B is more moderate than that as shown in FIG. 9. That is, the variation of alternating high and low dopant concentrations as shown in FIG. 9 occurs in each of the buffer layers 1022. The variation of alternating high and low dopant concentrations as shown in FIGS. 10A and 10B occurs in the two adjacent buffer layers 1022.

Referring to FIG. 4, the resulting stress buffering structure 102 according to the fifth embodiment can include a plurality of stacked buffer layers 1022 (e.g., at least three buffer layers) and a transition layer 1024 over the buffer layers 1022. Each of the buffer layers 1022 has a dopant concentration gradient in its thickness direction, and the dopant concentration gradient gradually increases from the reference concentration to the predetermined peak concentration and then gradually decreases from the predetermined peak concentration to the reference concentration. Each of the buffer layers 1022 has a thickness greater than 0 μm and less than 0.1 μm. The stress buffering structure 102 has a thickness of less than 0.1 mm.

Referring to FIG. 7, the resulting stress buffering structure 102 according to the fifth embodiment can include at least one first buffer layer 1022a, at least one second buffer layer 1022b alternately stacked with the at least one first buffer layer 1022a, and a transition layer 1024 over the first and second buffer layers 1022a, 1022b. The at least one first buffer layer 1022a has a first dopant concentration gradient in its thickness direction, and the at least one second buffer layer 1022b has a second dopant concentration gradient in its thickness direction, which is different from the first dopant concentration gradient. The first and second buffer layers 1022a, 1022b each have a thickness greater than 0 μm and less than 0.1 μm. The stress buffering structure 102 has a thickness of less than 0.1 mm. More specifically, if the first dopant concentration gradient gradually increases from the reference concentration to the predetermined peak concentration, the second dopant concentration gradient would gradually decrease from the predetermined peak concentration to the reference concentration. Furthermore, if the first dopant concentration gradient gradually decreases from the predetermined peak concentration to the reference concentration, the second dopant concentration gradient gradually increases from the reference concentration to the predetermined peak concentration.

Sixth Embodiment

Figure 11:
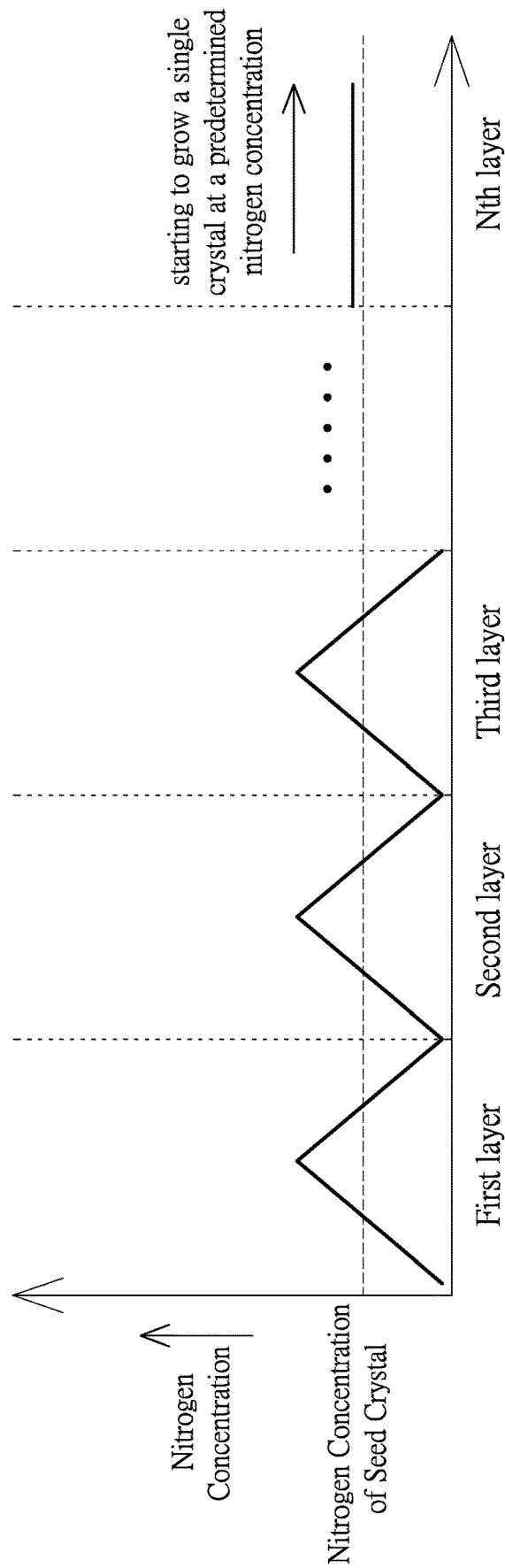
FIGS. 11, 12A and 12B are diagrams showing a variation of alternating high and low dopant concentrations in step S104 of the method according to a sixth embodiment of the instant disclosure.
Figure 12A:
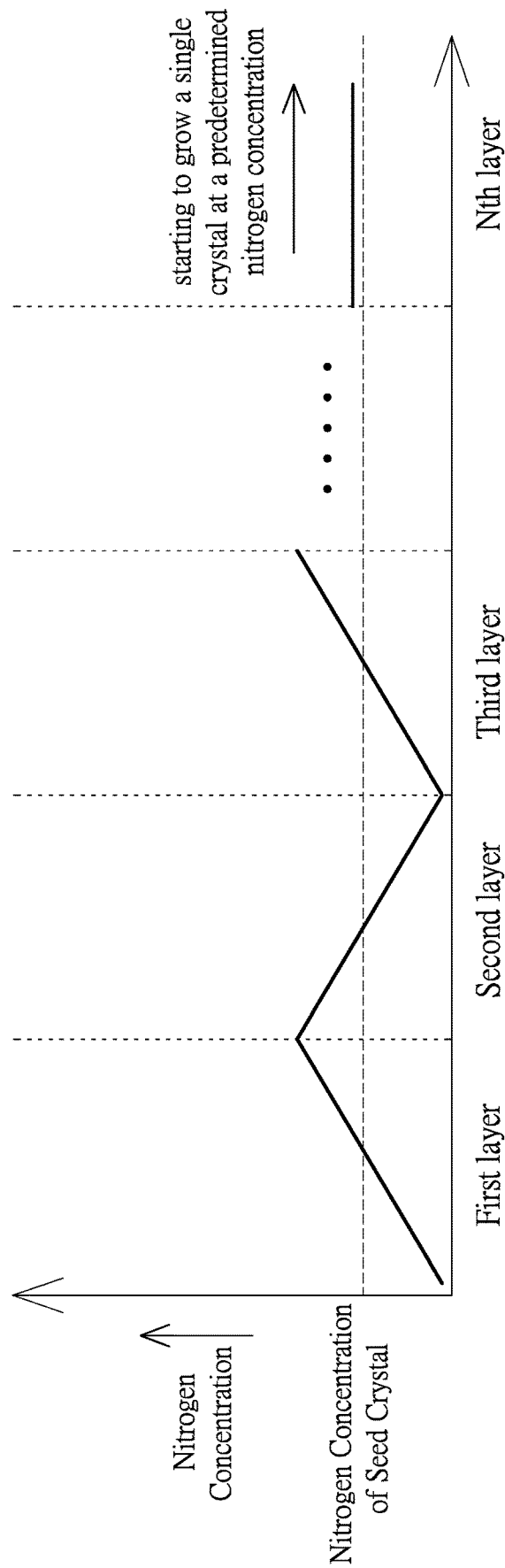
Figure 12B:
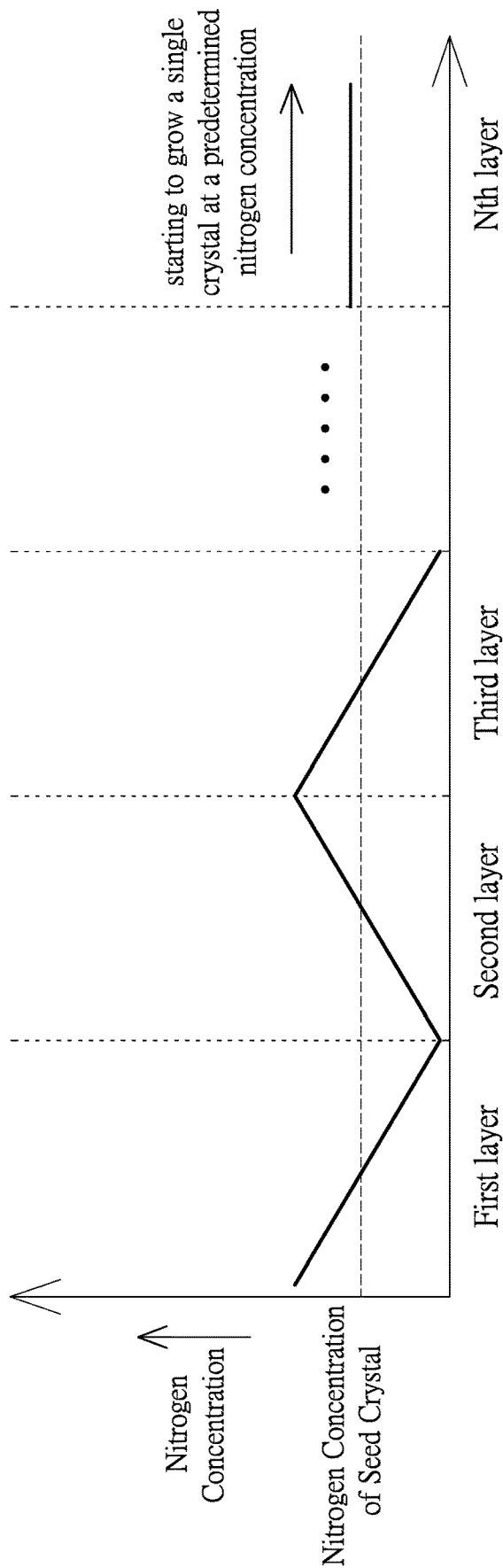

Reference is made to FIGS. 11, 12A and 12B, which show still another variation of alternating high and low dopant concentrations in the step S104. The main difference between the sixth and the above-mentioned embodiments is that, the dopant concentration of the stress buffering structure 102 is controlled to gradually increase or decrease between a second concentration lower than the dopant concentration of the seed layer 100 and a predetermined peak concentration. More specifically, the dopant of the stress buffering structure 102 has a variation of dopant concentration, in which the dopant concentration alternates between high and low concentrations. That is, the dopant concentration of the stress buffering structure 102 gradually increases from the second concentration to the predetermined peak concentration and then gradually decreases from the predetermined peak concentration to the second concentration in each of at least three successive predetermined time intervals, or gradually decreases from the predetermined peak concentration to the second concentration and then gradually increases from the second concentration to the predetermined peak concentration in each of the at least three successive predetermined time intervals.

It should be noted that, the variation of alternating high and low dopant concentrations as shown in FIGS. 12A and 12B is more moderate than that as shown in FIG. 11. That is, the variation of alternating high and low dopant concentrations as shown in FIG. 11 occurs in each of the buffer layers 1022. The variation of alternating high and low dopant concentrations as shown in FIGS. 12A and 12B occurs in the two adjacent buffer layers 1022.

Referring to FIG. 4, the resulting stress buffering structure 102 according to the sixth embodiment can include a plurality of stacked buffer layers 1022 (e.g., at least three buffer layers) and a transition layer 1024 over the buffer layers 1022. Each of the buffer layers 1022 has a dopant concentration gradient in its thickness direction, and the dopant concentration gradient gradually increases from the second concentration to the predetermined peak concentration and then gradually decreases from the predetermined peak concentration to the second concentration. Each of the buffer layers 1022 has a thickness greater than 0 μm and less than 0.1 μm. The stress buffering structure 102 has a thickness of less than 0.1 mm.

Referring to FIG. 7, the resulting stress buffering structure 102 according to the sixth embodiment can include at least one first buffer layer 1022a, at least one second buffer layer 1022b alternately stacked with the at least one first buffer layer 1022a, and a transition layer 1024 over the first and second buffer layers 1022a, 1022b. Each of the first buffer layers 1022a has a first dopant concentration gradient in its thickness direction, and each of the second buffer layers 1022b has a second dopant concentration gradient that is different from the first dopant concentration gradient in its thickness direction. The first and second buffer layers 1022a, 1022b each have a thickness greater than 0 μm and less than 0.1 μm. The stress buffering structure 102 has a thickness of less than 0.1 mm. More specifically, if the first dopant concentration gradient gradually increases from the second concentration to the predetermined peak concentration, the second dopant concentration gradient would gradually decrease from the predetermined peak concentration to the second concentration. Furthermore, if the first dopant concentration gradient gradually decreases from the predetermined peak concentration to the second concentration, the second dopant concentration gradient would gradually increase from the second concentration to the predetermined peak concentration.

Table 1 below shows the comparison of main defect densities between an SiC crystal of Comparative Example that is directly grown on a seed layer and SiC crystals of Examples 1-6 that are each grown on a seed layer by a stress buffering structure under the same growth conditions (e.g., temperature and pressure). The stress buffering structures of Examples 1-6 have different variation trends of dopant concentration according to the first to sixth embodiments.

TABLE 1

|  | Micropipe defect density (1/cm$^2$) | Basal plane dislocation density (1/cm$^2$) |
| --- | --- | --- |
| Comparative Example | 3 | 3,500 |
| Example 1 | 0.01 | 500 |
| Example 2 | 0.05 | 750 |
| Examples 3 and 4 | 0.03 | 600 |
| Example 5 | 0.1 | 800 |
| Example 6 | 0.2 | 900 |

As shown in Table 1, compared to the SiC crystal directly grown on the seed layer, the SiC crystals resulted from the stress buffering structure each have a reduced micropipe defect and a reduced basal plane dislocation density. Therefore, the instant method is capable of growing large-scale and high-quality crystals.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A silicon carbide crystal, comprising a seed layer, a bulk layer, and a stress buffering structure formed between the seed layer and the bulk layer, wherein the seed layer, the bulk layer, and the stress buffering structure are each formed with a dopant having a concentration, and the concentration of the dopant of the stress buffering structure cycles between high and low dopant concentrations in a thickness direction of the stress buffering structure;

characterized in that the stress buffering structure includes a plurality of stacked buffer layers and a transition layer over the buffer layers, wherein the buffer layer closest to the seed layer has the same variation trend of the concentration of the dopant as the buffer layer closest to the transition layer, and the concentration of the dopant of the transition layer is equal to the concentration of the dopant of the seed layer;

wherein the dopant of the seed layer has a reference concentration, and the concentration of the dopant of each of the buffer layers gradually increases or decreases between the reference concentration and a first concentration higher than the reference concentration in the thickness direction.

2. A silicon carbide crystal, comprising a seed layer, a bulk layer, and a stress buffering structure formed between the seed layer and the bulk layer, wherein the seed layer, the bulk layer, and the stress buffering structure are each formed with a dopant having a concentration, and the concentration of the dopant of the stress buffering structure cycles between high and low dopant concentrations in a thickness direction of the stress buffering structure;

characterized in that the stress buffering structure includes a plurality of stacked buffer layers and a transition layer over the buffer layers, wherein the buffer layer closest to the seed layer has the same variation trend of the concentration of the dopant as the buffer layer closest to the transition layer, and the concentration of the dopant of the transition layer is equal to the concentration of the dopant of the seed layer;

wherein the dopant of the seed layer has a reference concentration, and the concentration of the dopant of each of the buffer layers gradually increases from the reference concentration in the thickness direction to a peak concentration, and then gradually decreases from the peak concentration to the reference concentration in the thickness direction.

* * * * *